United States Patent [19]

Green

[11] B 3,982,199
[45] Sept. 21, 1976

[54] DIGITAL FREQUENCY SYNTHESIZER

[75] Inventor: Norman Green, Baltimore, Md.

[73] Assignee: The Bendix Corporation, Southfield, Mich.

[22] Filed: Jan. 6, 1975

[21] Appl. No.: 538,686

[44] Published under the second Trial Voluntary Protest Program on January 13, 1976 as document No. B 538,686.

[52] U.S. Cl. .......................... 331/51; 307/220 R; 328/14; 328/39; 328/48; 328/49
[51] Int. Cl.² ...................................... H03K 29/00
[58] Field of Search ................. 331/51; 328/14, 39, 328/48, 49; 307/220 R

[56] References Cited
UNITED STATES PATENTS
3,464,018   8/1969   Cliff ..................................... 328/14

Primary Examiner—John Kominski
Attorney, Agent, or Firm—W. G. Christoforo; Bruce L. Lamb

[57] ABSTRACT

A digital frequency synthesizer includes an oscillator and a variable frequency digital divider, whose divisor N is switchably selected for dividing the oscillator frequency. A counter accumulates a count related to the number of cycles of the divided oscillator frequency occurring in a unit time, with this number being used to set the divisor of a second digital frequency divider. The oscillator frequency is also divided by the second divider, with the resultant signal having a frequency of N Hz.

10 Claims, 1 Drawing Figure

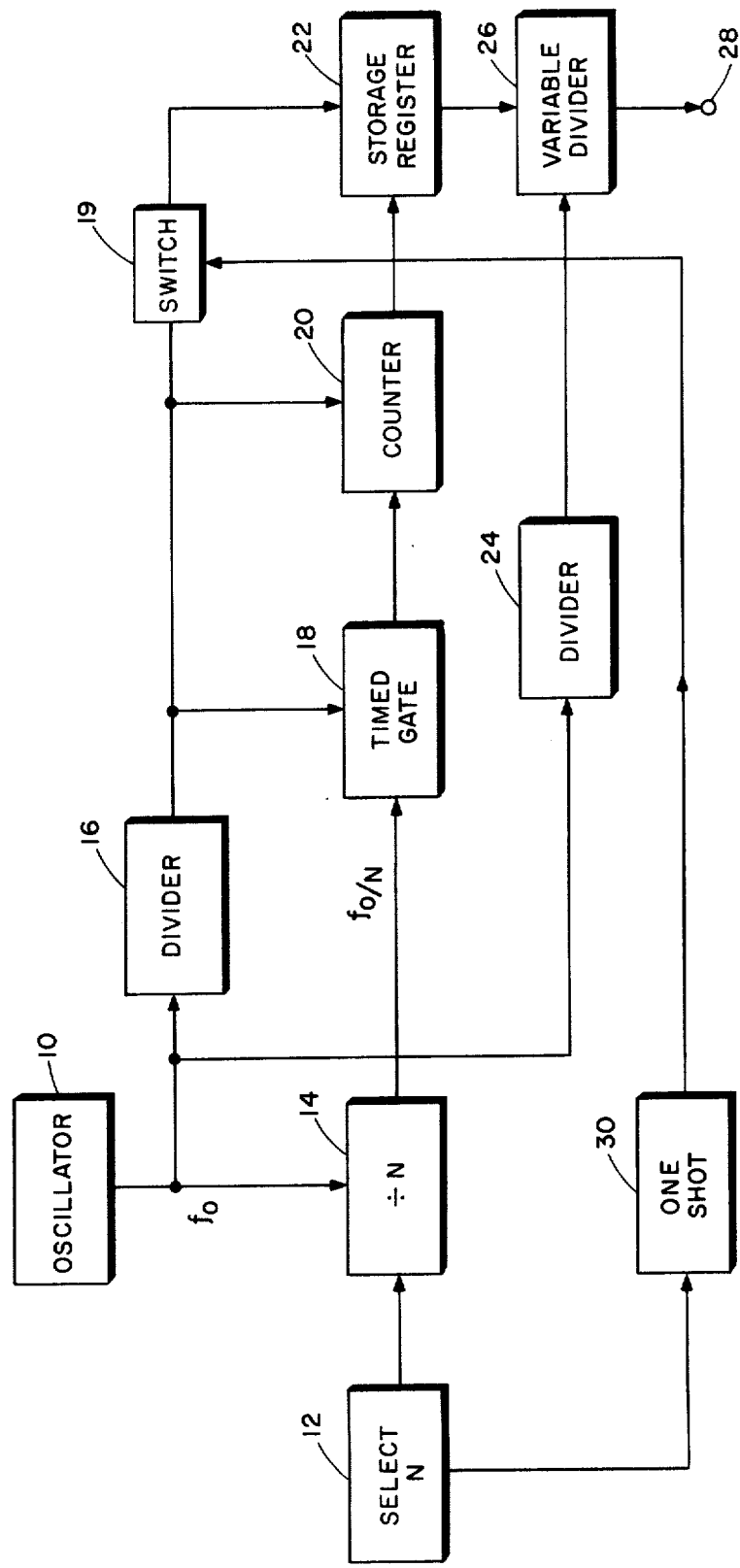

DIGITAL FREQUENCY SYNTHESIZER

BACKGROUND OF THE INVENTION

This invention relates to digital frequency synthesizers and particularly to such synthesizers which do not use phase locked loop techniques in their basic structure.

Digital frequency synthesizers are well known and their technology is well developed. Usually such synthesizers are of the phase locked loop type wherein a reference frequency source is phase locked to an output frequency signal which has been divided down by a variable digital frequency divider. The output frequencies are thus generally equal to the reference frequency times a factor N, where N is the divisor of the variable divider. The available output frequencies are thus evenly spaced by an amount equal to the reference frequency.

For frequencies which are less than the reference frequency, it is merely necessary to divide the reference frequency. If a variable digital frequency divider is used then the output frequencies obtainable are equal to the reference frequency divided by an interger N, where N is the divisor of the variable divider. Of course, in this case, the output frequencies are not evenly spaced.

SUMMARY OF THE INVENTION

A new digital frequency synthesizer is described herein which uses a reference oscillator and a variable digital frequency divider, whose divisor N can be set by a system operator, and which divider divides the oscillator frequency. An accurate time gate is provided which opens during a predetermined time to allow the divided down oscillator frequency to pass to a binary counter which thus accumulates a count related to the number of cycles of the divided oscillator frequency occurring in a unit time. This number is placed in a storage register and used to set the divisor of a second divider wherein the oscillator frequency is divided. The resultant signal can have a frequency of N Hz where N is the divisor of the first divider. Alternately, the output frequency can be an integral multiple or submultiple of N.

It is thus an object of this invention to provide a new digital frequency synthesizer.

It is another object of this invention to provide a digital frequency synthesizer which produces output frequencies which are less than a reference frequency.

A further object of this invention is to provide a digital frequency synthesizer which can produce output frequencies at single Hz spacing.

These and other objects of the invention will become apparent to one skilled in the art from a reading and understanding of the following description of the invention and the claims with reference to the FIGURE which illustrates a block diagram of an embodiment of the invention.

DESCRIPTION OF THE PREFERRED EMBODIMENT

Referring to the FIGURE, a reference oscillator 10 generates an output signal comprising a reference frequency $f_0$. The reference frequency is counted down by a variable digital frequency divider 14 whose divisor N is selected by some means 12. Means 12 can comprise, for example, BCD switches which can be calibrated directly in N. Other means of setting N are available to one skilled in the art. The output frequency of divider 14 is thus of course equal to $f_0/N$. This signal is applied through a timed gate 18 which, when open, permits the signal to pass to counter 20 wherein a count is accumulated which is related to the number of cycles of the signal applied thereto during the time that gate 18 is open.

As mentioned, gate 18 is opened for a predetermined period of time. The time base for gate 18 can, for example, be generated by a monostable multivibrator, or by dividing down an accurate frequency source. In this particular embodiment the frequency $f_0$ is divided down by divider 16 to provide the time base for gate 18. In addition, divider 16 generates a signal which is applied to counter 20 when gate 18 is opened to reset that counter and is applied through switch 19, when closed, to a storage register 22 to enter the count contained in counter 20 therein when gate 18 closes. The contents of storage register 22 are used to set the divisor of a programmable variable digital frequency divider 26, which receives the $f_0$ signal for division thereby. A divider 24 may optionally be interposed between oscillator 10 and divider 26 for reasons to be explained below.

In order to explain the operation of the digital frequency synthesizer, assume first that divider 24 is not used and frequency $f_0$ is applied directly for division to divider 26. Assume also that divider 16 and frequency $f_0$ are such that gate 18 is periodically opened for one second. The count thus accumulated in counter 20 and the divisor of divider 26 is thus equal to $f_0/N$. Since $f_0$ is divided by this divisor the output frequency appearing at terminal 28 will be equal to the divisor N of divider 14. Thus, the output frequency is numerically equal to the setting of the divisor N. The output frequency is independent of the absolute value of the reference frequency $f_0$.

To reduce the stabilization time of the frequency following the selection and setting of N in divider 14, the gate period may be reduced. To compensate for this gate time reduction, divider 24 is provided. For example, assume the gate time is selected to be one-half second. Accordingly, only half the required number of pulses wi'l be stored in storage register 22 resulting in this case in an output frequency of 2N. If the divisor of divider 24 is a divide by 2 circuit, however, the output frequency will be equal to N. It should be obvious from the above example that the present frequency synthesizer can be used to produce output frequencies at integral multiples of N. In addition, through the use of a variable divider 24, output frequencies which are a selectable integral multiple of N can be produced.

It should be noted that in a practical digital frequency synthesizer built in accordance with the principles of this invention it is merely necessary to set the proper divisor into divider 26 each time a new N is selected. Accordingly, switch 19 can be provided to interrupt the signal from divider 16 to register 22, which it will be remembered causes register 22 to store the contents of counter 20, after the new divisor has been set into divider 26. This switch may be simply a manually manipulated "lock" switch which is momentarily closed by the synthesizer operator after a new N is selected. Optimally, the switch can be automatically controlled by the perturbations normally generated when a new N is selected. For example, a one-shot 30 can be triggered to generate an enabling pulse for switch 19 whenever a new N is selected.

It will be noted that the number of counts accumulated in counter 20 depends upon the duration of the time gate and the reference frequency $f_0$. These are significant factors influencing the accuracy of the output signal, with accuracy increasing as the counts which are allowed to accumulate increases.

An understanding of this description of the invention will suggest certain modifications and alterations thereof to one skilled in the art. Accordingly, the invention is to be limited only by the true scope and spirit of the appended claims.

The invention claimed is:

1. A digital frequency synthesizer comprising:
   a source of a reference frequency signal;
   a variable digital frequency divider means for dividing said reference frequency signal by a selected integer N;
   a counter for accumulating a count related to the number of cycles of a frequency signal applied thereto;
   gate means for applying, when open, the reference frequency as divided by said variable digital frequency divider means to said counter, said gate means being open for a predetermined time period;
   programmable variable digital frequency divider means responsive to the count accumulated in said counter for setting the divisor thereof in proportion thereto and for dividing a frequency signal applied thereto by said divisor; and,
   means for applying said reference frequency signal to said programmable variable digital frequency divider.

2. The digital frequency synthesizer of claim 1 wherein said means for applying comprises another divider for dividing said reference frequency signal by a predetermined factor to thus produce a further signal having a frequency which is a submultiple of the reference frequency, said further signal being applied to said programmable variable digital frequency divider.

3. The digital frequency synthesizer of claim 1 wherein said gate means includes means responsive to said reference frequency signal for opening said gate means for said predetermined time period.

4. The digital frequency synthesizer of claim 1 including binary coded decimal switches for selecting the integer N.

5. The digital frequency synthesizer of claim 1 including switch means for enabling said programmable digital frequency divider to respond to the count accumulated in said counter whereby the divisor thereof is set.

6. The digital frequency synthesizer of claim 1 wherein said gate means includes timing means for generating a time signal having a predetermined period for opening said gate means and wherein said programmable variable digital frequency divider is enabled by said time signal to respond to the count accumulated in said counter whereby the divisor thereof is set.

7. The digital frequency synthesizer of claim 6 wherein said counter is set to an initial count in response to said time signal.

8. The digital frequency synthesizer of claim 7 including manually manipulated switch means for communicating said time signal to said programmable variable digital frequency divider.

9. The digital frequency synthesizer of claim 7 including switch means for communicating said time signal to said programmable variable digital frequency divider, and also including binary coded decimal switches for selecting the integer N, said switch means being responsive to manipulation of said binary coded decimal switches.

10. The digital frequency synthesizer of claim 7 including switch means responsive to selection of the integer N for communicating said time signal to said programmable variable digital frequency divider.

* * * * *